United States Patent
Su

(10) Patent No.: US 11,789,076 B2
(45) Date of Patent: Oct. 17, 2023

(54) APPARATUS AND METHOD OF MONITORING CHIP PROCESS VARIATION AND PERFORMING DYNAMIC ADJUSTMENT FOR MULTI-CHIP SYSTEM BY PULSE WIDTH

(71) Applicant: MEDIATEK INC., Hsin-Chu (TW)

(72) Inventor: Ko-Ching Su, Hsinchu (TW)

(73) Assignee: MEDIATEK INC., Hsin-Chu (TW)

( * ) Notice: Subject to any disclaimer, the term of this patent is extended or adjusted under 35 U.S.C. 154(b) by 300 days.

(21) Appl. No.: 17/065,493

(22) Filed: Oct. 7, 2020

(65) Prior Publication Data
US 2021/0141016 A1    May 13, 2021

Related U.S. Application Data

(60) Provisional application No. 62/934,039, filed on Nov. 12, 2019.

(51) Int. Cl.
*G01R 31/3185* (2006.01)
*G01R 31/319* (2006.01)

(52) U.S. Cl.
CPC . *G01R 31/318513* (2013.01); *G01R 31/3191* (2013.01)

(58) Field of Classification Search
CPC ............................ G01R 33/0017; G01R 35/00
See application file for complete search history.

(56) References Cited

U.S. PATENT DOCUMENTS

| | | | |
|---|---|---|---|
| 8,350,577 B1 * | 1/2013 | Ecker | G01R 35/005 324/601 |
| 8,461,847 B2 | 6/2013 | Teggatz | |
| 2005/0285605 A1 * | 12/2005 | Lin | G01R 31/31727 324/76.54 |
| 2006/0132339 A1 | 6/2006 | Alon | |
| 2011/0043243 A1 * | 2/2011 | Bhushan | G01R 31/2621 714/724 |
| 2013/0214831 A1 | 8/2013 | Park | |
| 2014/0070862 A1 | 3/2014 | Palmer | |
| 2019/0097651 A1 | 3/2019 | Nayyar | |

FOREIGN PATENT DOCUMENTS

TW    I654523 B    3/2019

OTHER PUBLICATIONS

Thomas Burd et al., "Zeppelin": An SoC for Multichip Architectures, IEEE Journal of Solid-State Circuits, vol. 54, No. 1, Jan. 2019, pp. 133-143, XP011705358.

* cited by examiner

*Primary Examiner* — Tung X Nguyen
(74) *Attorney, Agent, or Firm* — Winston Hsu

(57) ABSTRACT

A multi-chip system includes a plurality of chips and a monitoring and calibration system. The plurality of chips include at least a first chip and a second chip, wherein an output port of the first chip is connected to an input port of the second chip via a chip-to-chip connection, the first chip transmits an output signal to the second chip via the chip-to-chip connection, and the second chip processes an input signal that is derived from the output signal transmitted via the chip-to-chip connection. The monitoring and calibration system calibrates a chip setting of at least one of the first chip and the second chip for pulse width calibration of the input signal.

18 Claims, 5 Drawing Sheets

APPARATUS AND METHOD OF MONITORING CHIP PROCESS VARIATION AND PERFORMING DYNAMIC ADJUSTMENT FOR MULTI-CHIP SYSTEM BY PULSE WIDTH

CROSS REFERENCE TO RELATED APPLICATIONS

This application claims the benefit of U.S. provisional application No. 62/934,039, filed on Nov. 12, 2019 and incorporated herein by reference.

BACKGROUND

The present invention relates to a multi-chip system, and more particularly, to a multi-chip system with signal transmission by high frequency pulse.

Process variation is the naturally occurring variation in the attributes of semiconductor transistors in a chip when the chip is fabricated. The process variation causes measurable and predictable variance in the output performance of the chip. In general, the process variation of the chip will cause signal distortion in communication between chips and chips. Thus, there is a need for an innovative signal monitoring and calibration design that is capable of dealing with signal distortion impact on transmission.

SUMMARY

One of the objectives of the claimed invention is to provide a multi-chip system with pulse width monitoring and calibration and an associated pulse width monitoring and calibration method.

According to a first aspect of the present invention, an exemplary multi-chip system is disclosed. The exemplary multi-chip system includes a plurality of chips and a monitoring and calibration system. The plurality of chips comprise at least a first chip and a second chip, wherein an output port of the first chip is connected to an input port of the second chip via a chip-to-chip connection, the first chip is arranged to transmit an output signal to the second chip via the chip-to-chip connection, and the second chip is arranged to process an input signal that is derived from the output signal transmitted via the chip-to-chip connection. The monitoring and calibration system is arranged to calibrate a chip setting of at least one of the first chip and the second chip for pulse width calibration of the input signal.

According to a second aspect of the present invention, an exemplary pulse width monitoring and calibration method for a multi-chip system is disclosed. The multi-chip system comprises a plurality of chips, and the plurality of chips comprise at least a first chip and a second chip. The exemplary pulse width monitoring and calibration method includes: estimating and recording a pulse width of an input signal, wherein an output port of the first chip is connected to an input port of the second chip via a chip-to-chip connection, the first chip transmits an output signal to the second chip via the chip-to-chip connection, and the second chip processes the input signal that is derived from the output signal transmitted via the chip-to-chip connection; and according to the recorded pulse width of the input signal, calibrating a chip setting of at least one of the first chip and the second chip for pulse width calibration of the input signal.

According to a third aspect of the present invention, an exemplary pulse width monitoring and calibration method for a multi-chip system is disclosed. The multi-chip system includes a plurality of chips. The exemplary pulse width monitoring and calibration method includes: estimating and recording a pulse width of each of a plurality of input signals, wherein the plurality of chips are arranged to process a plurality of input signals, respectively; and checking recorded pulse widths of the plurality of input signals to select at least one chip that requires pulse width calibration.

These and other objectives of the present invention will no doubt become obvious to those of ordinary skill in the art after reading the following detailed description of the preferred embodiment that is illustrated in the various figures and drawings.

DETAILED DESCRIPTION

Certain terms are used throughout the following description and claims, which refer to particular components. As one skilled in the art will appreciate, electronic equipment manufacturers may refer to a component by different names. This document does not intend to distinguish between components that differ in name but not in function. In the following description and in the claims, the terms "include" and "comprise" are used in an open-ended fashion, and thus should be interpreted to mean "include, but not limited to . . . ". Also, the term "couple" is intended to mean either an indirect or direct electrical connection. Accordingly, if one device is coupled to another device, that connection may be through a direct electrical connection, or through an indirect electrical connection via other devices and connections.

Figure 1:
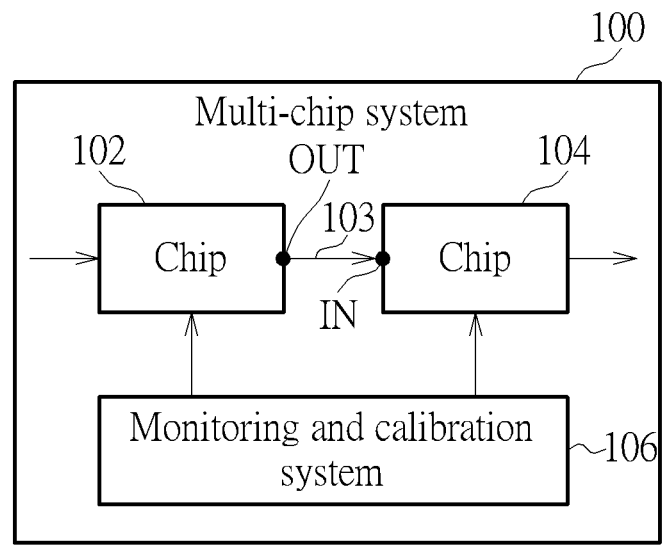
FIG. 1 is a diagram illustrating one multi-chip system according to an embodiment of the present invention.

FIG. 1 is a diagram illustrating one multi-chip system according to an embodiment of the present invention. The multi-chip system 100 includes a plurality of chips 102 and 104 and a monitoring and calibration system 106. The chips 102 and 104 are connected in series. As shown in FIG. 1, an output port OUT of the chip 102 is connected to an input port IN of the chip 104 via a chip-to-chip connection 103. Hence, the chip 102 is arranged to transmit an output signal to the chip 104 via the chip-to-chip connection 103, and the chip 104 is arranged to process an input signal that is derived from the output signal transmitted via the chip-to-chip connection 103. The monitoring and calibration system 106 is arranged to calibrate a chip setting of at least one of the chips 102 and 104 for achieving pulse width calibration.

Figure 2:
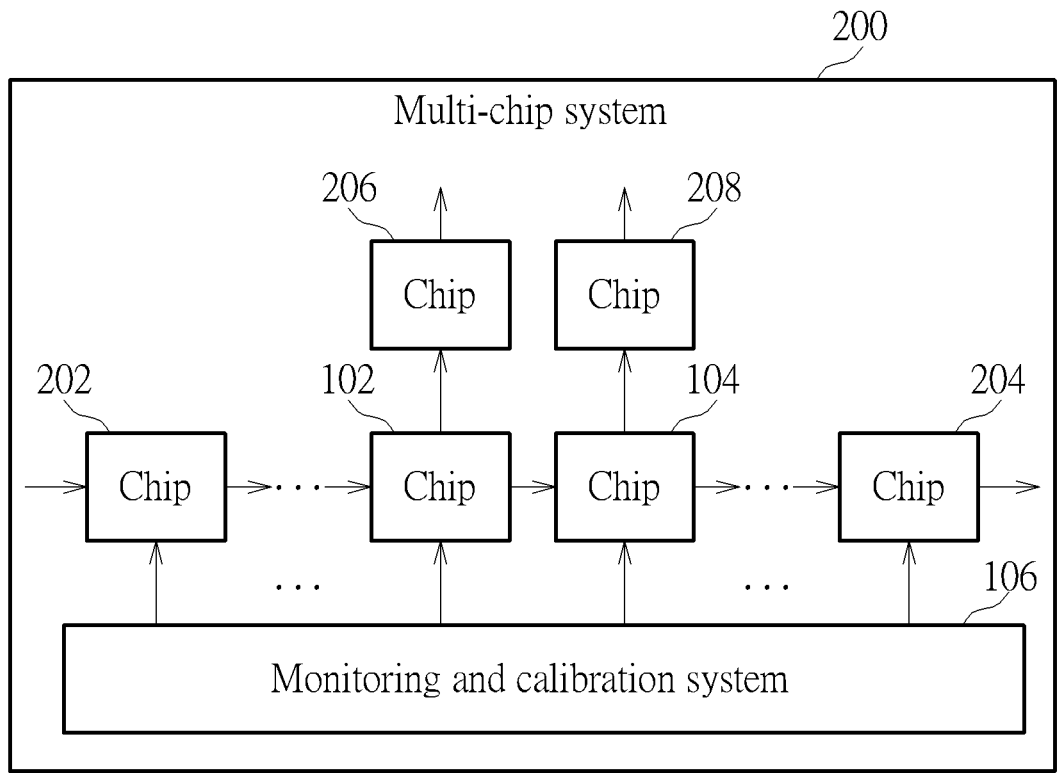
FIG. 2 is a diagram illustrating another multi-chip system according to an embodiment of the present invention.

The multi-chip system 100 is shown having only two chips connected in series. In practice, the proposed pulse width monitoring and calibration method may be applied to a multi-chip system with more than two chips connected in series. FIG. 2 is a diagram illustrating another multi-chip system according to an embodiment of the present invention. The major difference between the multi-chip systems 100 and 200 is that the multi-chip system 200 includes more than two series-connected chips, including chips 202, 204, 206 and 208 and the aforementioned chips 102 and 104. The aforementioned chips 202 and 204 are two chips included in the series-connected chips in a first dimension. The chip 202 is the first chip of the series-connected chips in the first dimension, and is used to receive a raw data to be processed by the series-connected chips. The chip 204 is the last chip of the series-connected chips in the first dimension, and is used to output a processed data of the series-connected chips. In one alternative design, the chip 202 may be omitted, and the chip 102 may be the first chip of the series-connected chips for receiving a raw data to be processed by the series-connected chips. In another alternative design, the chip 204 may be omitted, and the chip 104 may be the last chip of the series-connected chips for outputting a processed data of the series-connected chips. Furthermore, chips 102 and 206 are two chips in the series-connected chips in a second dimension, and chips 104 and 208 are two chips in the series-connected chips in the second dimension. In practice, the present invention has no limitations on dimensions of the multi-chip system. That is, the proposed pulse width monitoring and calibration method may be applied to a single-dimensional multi-chip system or a multi-dimensional multi-chip system, depending upon actual application requirements. Like the embodiment shown in FIG. 1, the monitoring and calibration system 106 is used to calibrate a chip setting of at least one of the series-connected chips for pulse width calibration.

Figure 3:
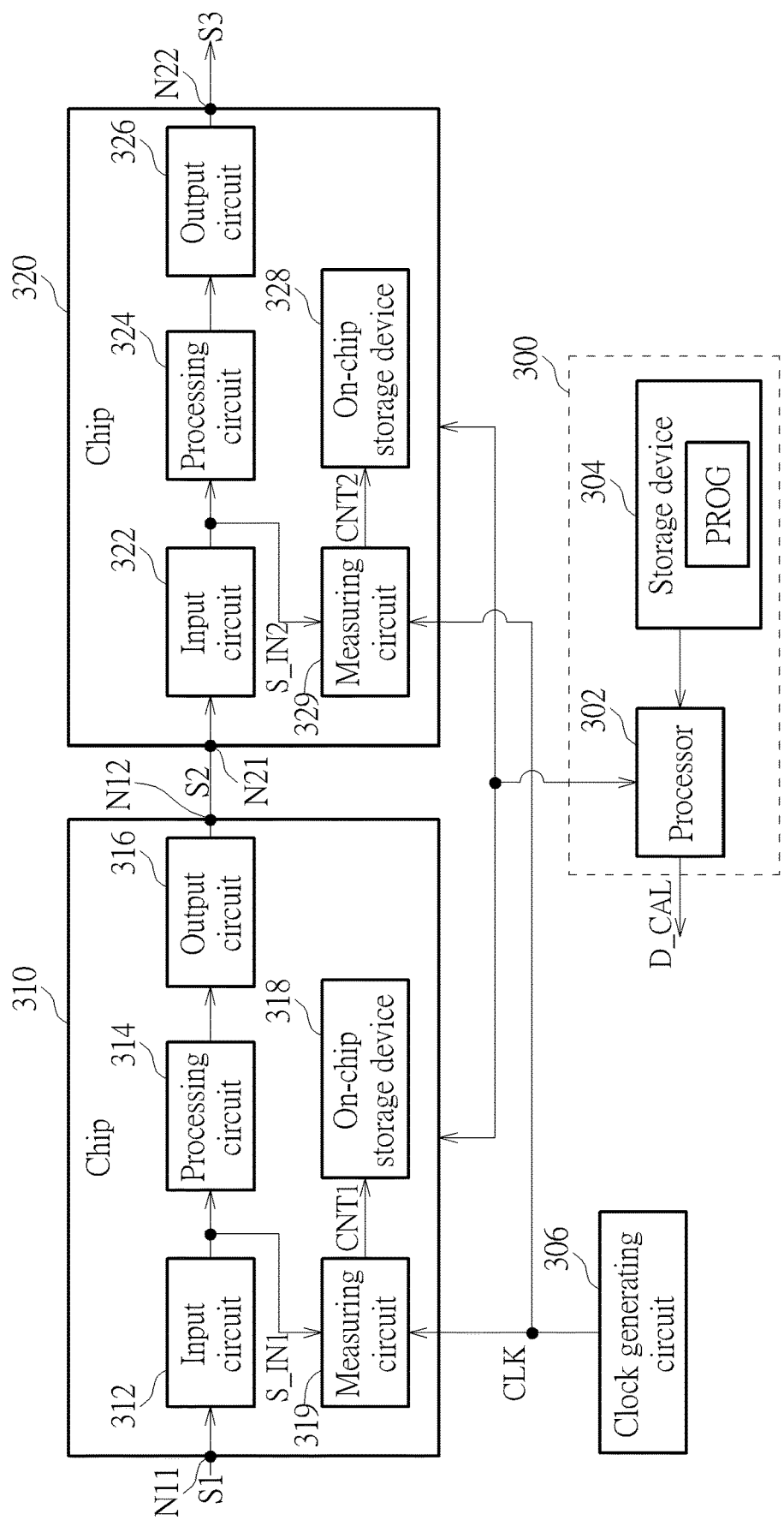
FIG. 3 is a diagram illustrating a pulse width calibration design according to an embodiment of the present invention.

FIG. 3 is a diagram illustrating a pulse width calibration design according to an embodiment of the present invention. The monitoring and calibration system 106 shown in FIG. 1/FIG. 2 may be implemented by the monitoring and calibration system 300. The monitoring and calibration system 300 includes a processor 302 and a storage device 304. For example, the storage device 304 may be a hard disk drive, a solid-state drive, or a memory device. A program code PROG is stored in the storage device 304. When the program code PROG is loaded and executed by the processor 302, the program code PROG instructs the processor 302 to start the signal calibration flow. For example, the proposed signal calibration flow may be automatically initiated at the time the multi-chip system 100/200 is powered on.

Figure 4:
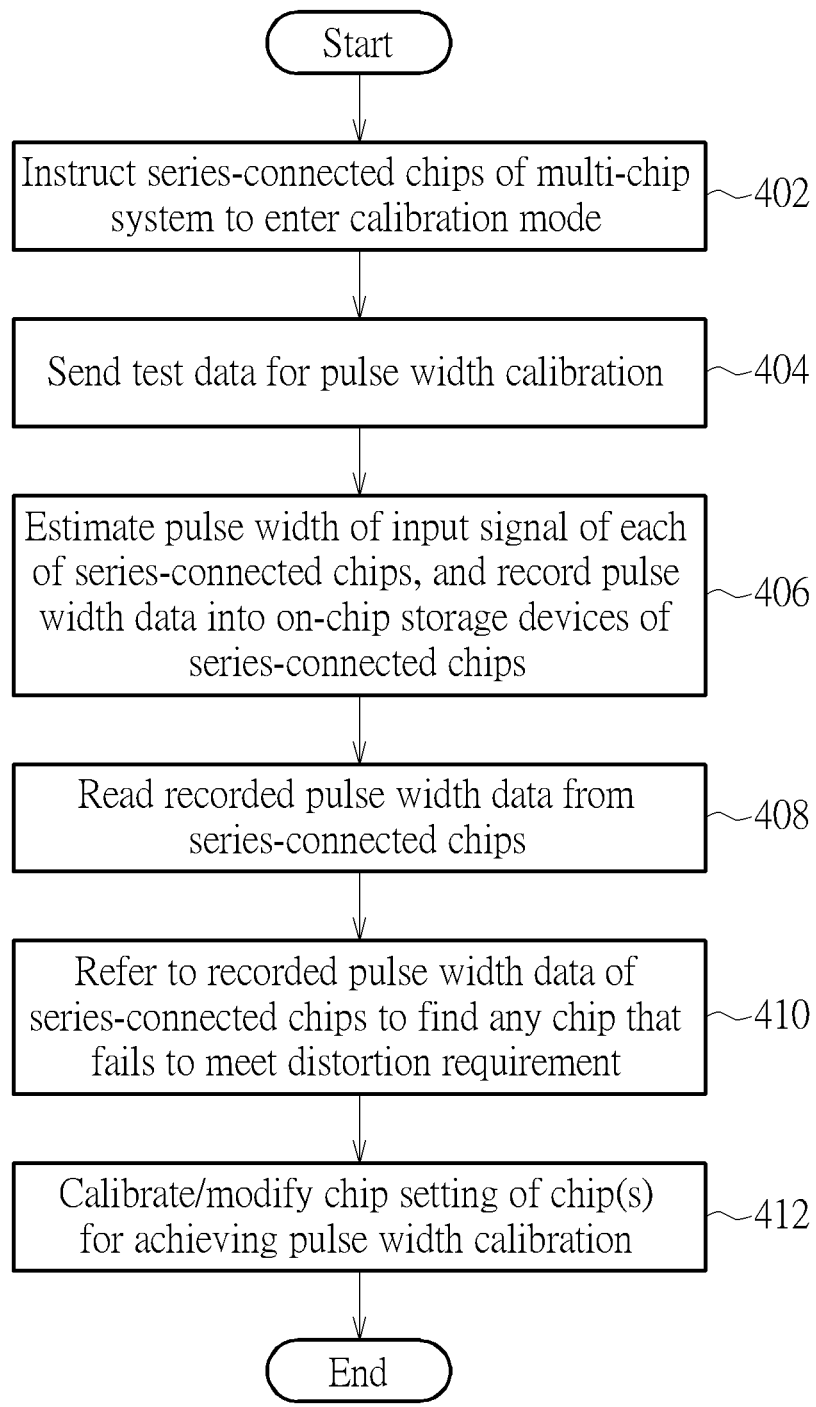
FIG. 4 is a flowchart illustrating a pulse width monitoring and calibration method according to an embodiment of the present invention.

Please refer to FIG. 3 in conjunction with FIG. 4. FIG. 4 is a flowchart illustrating a pulse width monitoring and calibration method according to an embodiment of the present invention. The pulse width monitoring and calibration method may be employed by the system shown in FIG. 3. Provided that the result is substantially the same, the steps are not required to be executed in the exact order shown in FIG. 4. For brevity and simplicity, the following assumes that the multi-chip system 200/300 is implemented by the system shown in FIG. 3, where the monitoring and calibration system 106 is implemented by the monitoring and calibration system 300, and two of the series-connected chips of the multi-chip system 200/300 are implemented by chips 310 and 320.

At step 402, the program code PROG running on the processor 302 instructs series-connected chips in the multi-chip system 200/300 to enter a calibration mode. For example, the chip 102 shown in FIG. 1/FIG. 2 may be implemented by the chip 310, and the chip 104 shown in FIG. 1/FIG. 2 may be implemented by the chip 320. The series-connected chips in the multi-chip system 200/300 may be identical chips. However, this is not meant to be a limitation of the present invention.

During the calibration mode, each of the series-connected chips in the multi-chip system 100/200 may bypass a data signal at its input port to its output port through an internal signal processing path. As shown in FIG. 3, the chip 310 includes an input circuit 312, a processing circuit 314, an output circuit 316, an on-chip storage device 318, and a measuring circuit 319; and the chip 320 includes an input circuit 322, a processing circuit 324, an output circuit 326, an on-chip storage device 328, and a measuring circuit 329. For example, the on-chip storage devices 318 and 328 may be registers or static random access memories (SRAMs). It should be noted that only the components pertinent to the present invention are shown in FIG. 3. In practice, each of the chips 310 and 320 may have other components for designated functions.

Regarding the chip 310, the input circuit 312 is arranged to derive an input signal S_IN1 from a data signal S1 at an input port N11, and the output circuit 316 is arranged to generate and transmit a data signal S2 to an output port N12. Regarding the chip 320, the input circuit 322 is arranged to derive an input signal S_IN2 from the data signal S2 at an input port N21, and the output circuit 326 is arranged to generate and transmit a data signal S3 to an output port N22. It should be noted that the data signal S2 is transmitted via a chip-to-chip connection between chips 310 and 320. During the calibration mode, the processing circuit 314 may bypass the input signal S_IN1 (which is an output of input circuit 322) to the output circuit 316, and the processing circuit 324 may bypass the input signal S_IN2 (which is an output of input circuit 322) to the output circuit 326.

At step 404, the program code PROG running on the processor 302 generates and sends test data D_CAL for pulse width calibration. For example, the test data D_CAL may be set by 0xAA, such that 1's and 0's are transmitted alternately. The test data D_CAL is fed into the first chip of the series-connected chips of the multi-chip system 100/200. Hence, during the calibration mode, input signals and output signals of the series-connected chips are derived from the same test data D_CAL. Ideally, waveforms of input signals and output signals of the series-connected chips should be identical to a waveform of the test data D_CAL. Unfortunately, the series-connected chips have process variation, and a waveform of an input signal or an output signal of at least one of the series-connected chips may be distorted to be different from the waveform of the test data D_CAL.

At step 406, a pulse width of an input signal of each of the series-connected chips in the multi-chip system 100/200 is estimated and recorded. For example, when the chips 310 and 320 operate under the calibration mode, the measuring circuit 319 estimates a pulse width of the input signal S_IN1, and the measuring circuit 329 estimates a pulse width of the input signal S_IN2. In this embodiment, the measuring circuit 319 receives a high-frequency clock CLK generated from a clock generating circuit 306 such as a phase-locked loop (PLL) circuit, and uses clock edges (e.g., rising edges) of the high-frequency clock CLK to sample the input signal S_IN1 for counting the pulse width of the input signal S_IN1. Similarly, the measuring circuit 329 receives the high-frequency clock CLK generated from the clock generating circuit 306, and uses clock edges (e.g., rising edges) of the high-frequency clock CLK to sample the input signal S_IN2 for counting the pulse width of the input signal S_IN2.

Figure 5:
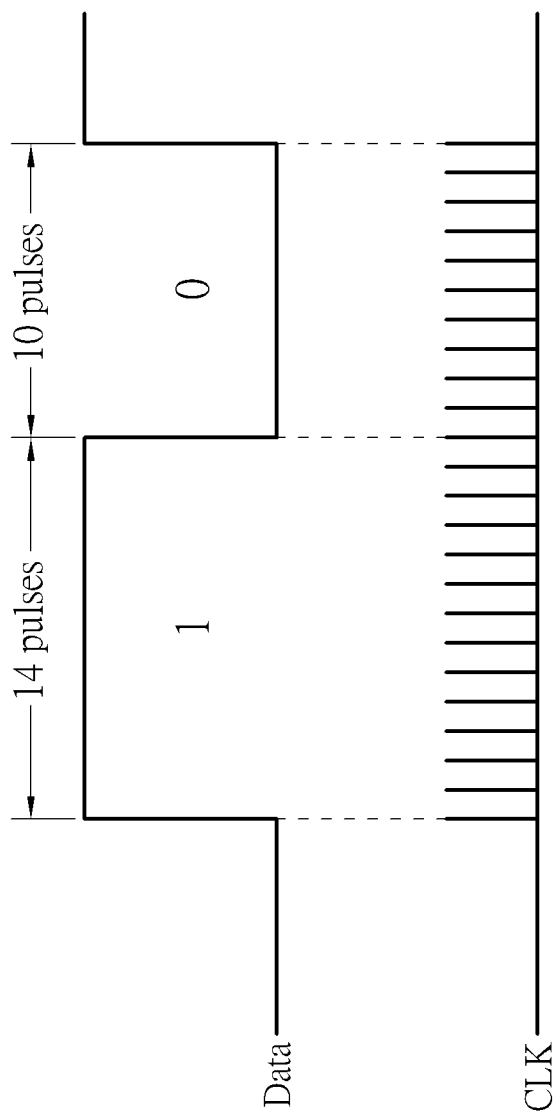
FIG. 5 is a diagram illustrating pulse width estimation performed by a measuring circuit according to an embodiment of the present invention.

FIG. 5 is a diagram illustrating pulse width estimation performed by a measuring circuit according to an embodiment of the present invention. A data signal at one chip (e.g., input signal S_IN1 of chip 310 or input signal S_IN2 of chip 320) is sampled by the high-frequency clock CLK. In a case where the test data D_CAL is set by 0xAA, the high-frequency clock CLK should have M pulses (or M rising edges) during the elapsed time of transmitting one data bit "1", and should have N pulses (or N rising edges) during the elapsed time of transmitting one data bit "0", where M=N. As mentioned above, the process variation will cause signal distortion in transmission, thus resulting in MON. As shown in FIG. 5, the high-frequency clock CLK has 14 pulses (or 14 rising edges) during the elapsed time of transmitting one data bit "1", and has 10 pulses (or 10 rising edges) during the elapsed time of transmitting one data bit "0". The estimated pulse width of each chip operating under the calibration mode is recorded for the following pulse width calibration process. In this embodiment, the measuring circuit 319 records a count value CNT1 (which is representative of the pulse width of the input signal S_IN1) into the on-chip storage device 318 of the chip 310, and the measuring circuit 329 records a count value CNT2 (which is representative of the pulse width of the input signal S_IN2) into the on-chip storage device 328 of the chip 320.

After pulse width estimation of series-connected chips in the same multi-chip system 100/200 is done by the series-connected chips (particularly, measuring circuits included in the series-connected chips), the program code PROG running on the processor 302 reads the recorded pulse width data from the series-connected chips (step 408). At step 410, the program code PROG running on the processor 302 refers to the recorded pulse width data of the series-connected chips to find any chip that fails to meet the distortion requirement. For example, the program code PROG running on the processor 302 checks the count value CNT1 read from the on-chip storage device 318 to determine if pulse width calibration of the input signal S_IN1 generated from the input circuit 312 to the processing circuit 314 is required, and checks the count value CNT2 read from the on-chip storage device 328 to determine if pulse width calibration of the input signal S_IN2 generated from the input circuit 322 to the processing circuit 324 is required.

When a specific chip fails to meet the distortion requirement, the program code PROG running on the processor 302 calibrates (modifies) a chip setting of the specific chip and/or a chip setting of another chip that precedes the specific chip according to recorded pulse width data of the specific chip (step 412). Suppose that the chip 320 is found having the recorded pulse width (i.e., count value CNT2) that fails to meet the distortion requirement due to being larger than an upper bound of a pulse width range or smaller than a lower bound of the pulse width range. In one exemplary design, the program code PROG running on the processor 302 achieves pulse width calibration of the input signal S_IN2 (which is generated from the input circuit 322 to the processing circuit 324) by tuning the output circuit 316 of the chip 310. In another exemplary design, the program code PROG running on the processor 302 achieves pulse width calibration of the input signal S_IN2 (which is generated from the input circuit 322 to the processing circuit 324) by tuning the input circuit 322 of the chip 320. In yet another exemplary design, the program code PROG running on the processor 302 achieves pulse width calibration of the input signal S_IN2 (which is generated from the input circuit 322 to the processing circuit 324) by tuning the output circuit 316 of the chip 310 as well as the input circuit 322 of the chip 320.

Briefly summarized, the proposed pulse width calibration technique can be employed by a multi-chip system having two or more chips connected in series, where a pulse width of an input signal of each chip is estimated and recorded by the chip itself, the recorded pulse width data are read from series-connected chips to find any chip that fails to meet the distortion requirement, and pulse width calibration is achieved by chip setting modification that is based on the recorded pulse width data.

Figure 6:
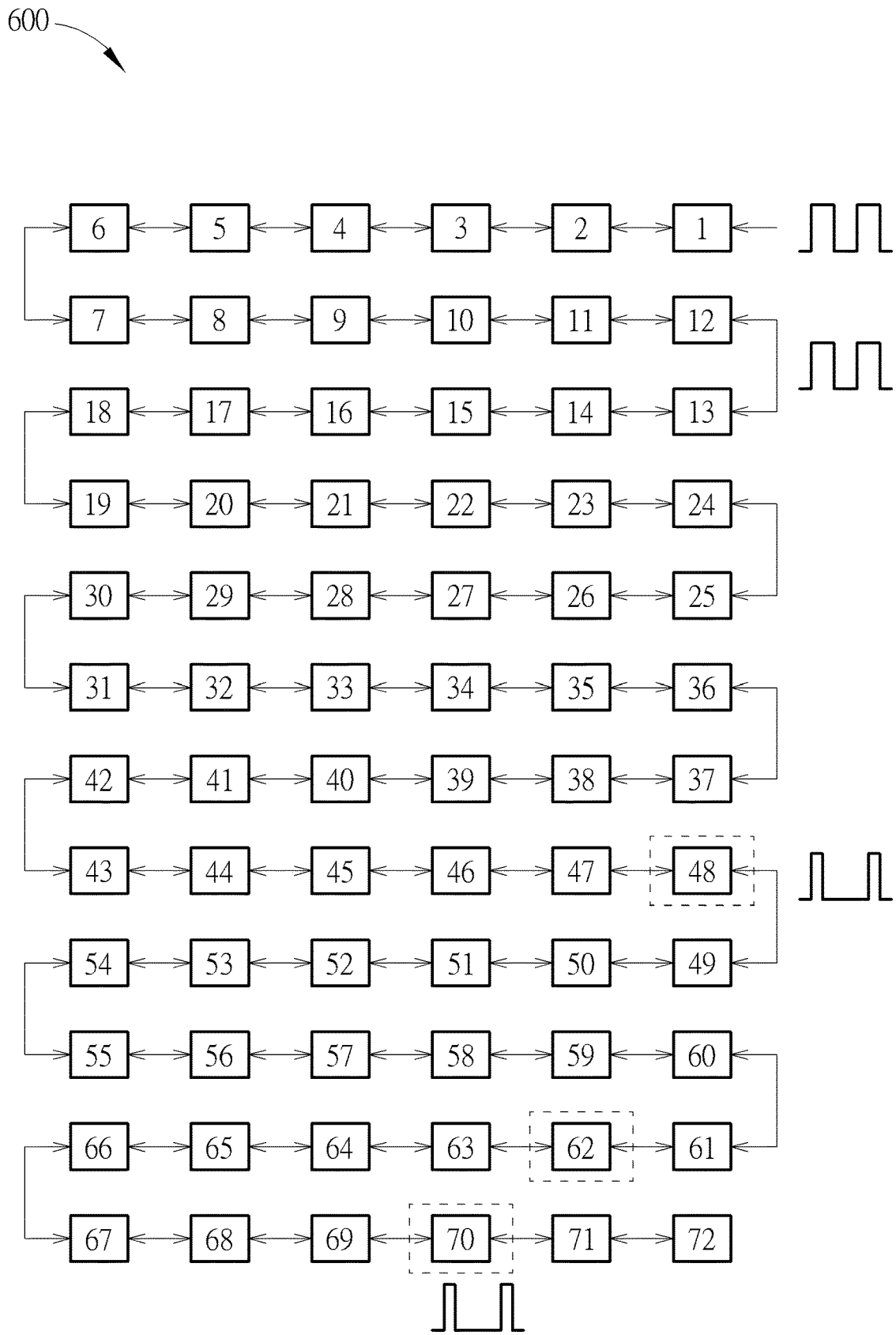
FIG. 6 is a diagram illustrating a multi-chip system with a lot of series-connected chips according to an embodiment of the present invention.

The proposed pulse width monitoring and calibration method is capable of eliminating signal distortion impact during series transmission. Hence, the proposed pulse width monitoring and calibration method can maximize the number of series-connected chips implemented on the multi-chip system to enhance the computing power. FIG. 6 is a diagram illustrating a multi-chip system with a lot of series-connected chips according to an embodiment of the present invention. By way of example, but not limitation, the multi-chip system 600 may be used for a bitcoin mining application, an artificial intelligence (AI) application, or any application that requires high computing power. In this embodiment, the multi-chip system 600 has 72 chips connected in series. When step 410 finds that chips indexed by "48", "62" and "70" fail to meet the distortion requirement, step 412 modifies chip settings for achieving pulse width calibration of input signals at the chips indexed by "48", "62" and "70". With the help of the proposed signal calibration technique, the multi-chip system 600 is allowed to have a large number of chips for offering high computing power required by certain applications.

In above embodiments, the program code PROG running on the processor 302 is designed to control the signal calibration flow. However, this is for illustrative purposes only, and is not meant to be a limitation of the present invention. In practice, the multi-chip system with pulse width calibration may employ software-based calibration control or hardware-based calibration control, depending upon the actual design considerations. For example, the monitoring and calibration system 106 shown in FIG. 1 and FIG. 2 may be implemented by hardware only. Hence, the signal calibration flow in FIG. 4 may be controlled by hardware without intervention of software.

In above embodiments, the term "pulse width" means a high pulse width (e.g., elapsed time of transmitting one data bit "1"). However, this is for illustrative purposes only, and is not meant to be a limitation of the present invention. In some embodiments of the present invention, the term "pulse width" may mean a low pulse width (e.g., elapsed time of transmitting one data bit "0"). To put it simply, the pulse width estimation can be implemented by any means that is capable of capturing signal variation of each chip. These alternative designs all fall within the scope of the present invention.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:
1. A multi-chip system comprising:
a plurality of chips, comprising at least a first chip and a second chip, wherein an output port of the first chip is connected to an input port of the second chip via a chip-to-chip connection, the first chip is arranged to transmit an output signal to the second chip via the chip-to-chip connection, and the second chip is arranged to process an input signal that is derived from the output signal transmitted via the chip-to-chip connection; and a monitoring and calibration system, arranged to calibrate a chip setting of at least one of the first chip and the second chip for pulse width calibration of the input signal.

2. The multi-chip system of claim 1, wherein the plurality of chips comprise more than two chips connected in series.

3. The multi-chip system of claim 1, wherein the monitoring and calibration system is further arranged to generate test data for pulse width calibration, and instruct each of the first chip and the second chip to enter a calibration mode; during the calibration mode, the output signal is derived from said test data, and the second chip estimates and records a pulse width of the input signal; and the monitoring and calibration system is further arranged to read the recorded pulse width of the input signal, where the chip setting of said at least one of the first chip and the second chip is calibrated according to the recorded pulse width of the input signal.

4. The multi-chip system of claim 3, wherein the first chip has an output circuit arranged to provide the output signal, and said pulse width calibration of the input signal comprises tuning the output circuit of the first chip.

5. The multi-chip system of claim 3, wherein the second chip has an input circuit arranged to provide the input signal, and said pulse width calibration of the input signal comprises tuning the input circuit of the second chip.

6. The multi-chip system of claim 3, wherein the second chip is further arranged to use a reference clock to sample the pulse width of the input signal for generating and recording a count value that is representative of the pulse width of the input signal; and the monitoring and calibration system is further arranged to check the recorded count value to determine if said pulse width calibration of the input signal is required.

7. The multi-chip system of claim 3, wherein the monitoring and calibration system comprises a processor, and a program code is loaded and executed by the processor to generate said test data, and instruct the first chip and the second chip to enter the calibration mode.

8. The multi-chip system of claim 1, wherein the plurality of chips are arranged to process a plurality of input signals, respectively; each of the plurality of chips is arranged to use a reference clock to sample a pulse width of a corresponding input signal for generating and recording a count value that is representative of the pulse width of the corresponding input signal; and the monitoring and calibration system is further arranged to check recorded count values of the plurality of chips to select the second chip that requires pulse width calibration.

9. A pulse width monitoring and calibration method for a multi-chip system that comprises a plurality of chips, the plurality of chips comprising at least a first chip and a second chip, the pulse width monitoring and calibration method comprising:

estimating and recording a pulse width of an input signal, wherein an output port of the first chip is connected to an input port of the second chip via a chip-to-chip connection, the first chip transmits an output signal to the second chip via the chip-to-chip connection, and the second chip processes the input signal that is derived from the output signal transmitted via the chip-to-chip connection; and according to the recorded pulse width of the input signal, calibrating a chip setting of at least one of the first chip and the second chip for pulse width calibration.

10. The pulse width monitoring and calibration method of claim 9, further comprising:

generating test data for pulse width calibration during a calibration mode; wherein the input signal is derived from said test data.

11. The pulse width monitoring and calibration method of claim 9, wherein the plurality of chips comprise more than two chips connected in series.

12. The pulse width monitoring and calibration method of claim 9, wherein the first chip has an output circuit arranged to provide the output signal, and calibrating the chip setting of at least one of the first chip and the second chip comprises:

tuning the output circuit of the first chip.

13. The pulse width monitoring and calibration method of claim 9, wherein the second chip has an input circuit arranged to provide the input signal, and calibrating the chip setting of at least one of the first chip and the second chip comprises:

tuning the input circuit of the second chip.

14. The pulse width monitoring and calibration method of claim 9, wherein estimating and recording the pulse width of the input signal comprises:

using a reference clock to sample the pulse width of the input signal for generating and recording a count value that is representative of the pulse width of the input signal; and calibrating the chip setting of said at least one of the first chip and the second chip comprises:

checking the recorded count value to determine if said pulse width calibration of the input signal is required.

15. A pulse width monitoring and calibration method for a multi-chip system that comprises a plurality of chips, comprising:

estimating and recording a pulse width of each of a plurality of input signals, wherein the plurality of chips are arranged to process the plurality of input signals, respectively; and checking recorded pulse widths of the plurality of input signals to select at least one chip that requires pulse width calibration.

16. The pulse width monitoring and calibration method of claim 15, further comprising:

generating test data for pulse width calibration during a calibration mode; wherein said each of the plurality of input signals is derived from said test data.

17. The pulse width monitoring and calibration method of claim 15, wherein estimating and recording the pulse width of said each of the plurality of input signals comprises:

using a reference clock to sample a pulse width of a corresponding input signal of said each of the plurality of chips for generating and recording a count value that is representative of the pulse width of the corresponding input signal.

18. The pulse width monitoring and calibration method of claim 15, wherein the plurality of chips comprise more than two chips connected in series.

* * * * *